US010559952B2

(12) United States Patent
Asam et al.

(10) Patent No.: US 10,559,952 B2
(45) Date of Patent: Feb. 11, 2020

(54) DIGITAL LINE PROTECTION

(71) Applicant: Infineon Technologies AG, Neubiberg (DE)

(72) Inventors: Michael Asam, Inchenhofen-Sainbach (DE); Alfons Graf, Kaufering (DE)

(73) Assignee: Infineon Technologies AG, Neubiberg (DE)

( * ) Notice: Subject to any disclaimer, the term of this patent is extended or adjusted under 35 U.S.C. 154(b) by 244 days.

(21) Appl. No.: 15/675,097

(22) Filed: Aug. 11, 2017

(65) Prior Publication Data

US 2019/0052074 A1 Feb. 14, 2019

(51) Int. Cl.
*H02H 3/08* (2006.01)
*G01R 31/382* (2019.01)
*G01R 19/25* (2006.01)
*G01R 31/08* (2006.01)
*H02H 7/08* (2006.01)
*H02H 7/22* (2006.01)

(52) U.S. Cl.
CPC ........... *H02H 3/08* (2013.01); *G01R 19/2506* (2013.01); *G01R 31/085* (2013.01); *G01R 31/382* (2019.01); *H02H 7/0844* (2013.01); *H02H 7/226* (2013.01)

(58) Field of Classification Search
CPC .. H02H 7/263; H02H 3/044; G01R 19/16571; G01R 31/086; H04B 3/46

USPC ................................................ 361/93.1–93.9
See application file for complete search history.

(56) References Cited

U.S. PATENT DOCUMENTS

| 2008/0033254 | A1* | 2/2008 | Kamath | ............. A61B 5/14532 600/300 |
| 2011/0227500 | A1 | 9/2011 | West | |
| 2014/0198419 | A1* | 7/2014 | Kojovic | ................... H02H 3/20 361/78 |
| 2016/0109212 | A1 | 4/2016 | Bader et al. | |
| 2017/0060152 | A1 | 3/2017 | Martini | |

OTHER PUBLICATIONS

U.S. Appl. No. 15/675,107, filed Aug. 11, 2017, by Michael Asam.

* cited by examiner

*Primary Examiner* — Dharti H Patel
(74) *Attorney, Agent, or Firm* — Shumaker & Sieffert, P.A.

(57) ABSTRACT

A line protection device includes terminals to connect the line protection device in series with an electric line. A current sensor of the line protection device senses a value of electric current through the electric line. A digital filter circuit of the line protection device performs digital filtering of the value of electric current. Depending on the digitally filtered value of the electric current, a switch control circuit of the line protection device controls a switch to interrupt flow of the electric current through the line.

21 Claims, 8 Drawing Sheets

DIGITAL LINE PROTECTION

TECHNICAL FIELD

The present application relates to a line protection device and to a method of line protection.

BACKGROUND

For protection of electric lines, such as wires, cables, conductor strips, or connectors, it is known to use fuses, which prevent the electric line from being damaged by excessive current flow.

Typically, a fuse is selected with characteristics which match a weakest element of the electric line to be protected. In this respect, it needs to be considered that heating of the electric line will typically depend on the magnitude of electric current flowing through the electric line and on a time duration for which the electric current is flowing through the electric line. That is to say, damage of the line may be caused by a relatively high electric current flowing for a relatively short time duration or by a lower electric current flowing for a longer duration. This behavior may be represented in terms of a time-current characteristic, e.g., given by the time duration of current flow as a function of the magnitude of the current resulting in a maximum allowable temperature increase of the electric line. For example, in the case of electrical cables a critical aspect is the temperature stability of an insulator of the cable. As a general rule, sensitivity of an electric line depends on various parameters, such as line geometry, conductor material, and insulator material. Further, the sensitivity typically also depends on ambient temperature of the electric line. In view of the above situation, various types of fuses exist so that it becomes possible to select a fuse which suits the characteristics of the electric line to be protected.

Further, it is known to use electronic fuses. An electronic fuse may be implemented on the basis of a semiconductor switch which is opened depending on an electrical current flowing through the protected electric line. By way of example, US 2016/0109212 A1 describes an electronic fuse device which also supports modelling of a fuse characteristic by analog circuitry or by a software model. However, designing analog circuitry to achieve a certain fuse characteristic may be a complex task. Further, implementing a software model of a fuse may result in increased complexity of the electronic fuse device.

Accordingly, there is a need for techniques which allow for efficiently protecting an electric line.

SUMMARY

According to an embodiment, a line protection device is provided. The line protection device comprises terminals, a current sensor, a digital filter circuit, a switch control circuit, and a supply circuit. The terminals are adapted to connect the line protection device in series with an electric line. The current sensor is adapted to a sense a value of electric current through the electric line. The digital filter circuit is adapted to perform digital filtering of the value of electric current. The switch control circuit is adapted to control a switch to interrupt flow of the electric current through the electric line depending on the digitally filtered value of the electric current. The supply circuit is adapted to power at least the digital filter circuit from at least one of the terminals. The line protection device may also comprise the switch. However, it is also possible that the switch is provided separately from the line protection device and controlled by a signal from the line protection device.

According to a further embodiment, a method of line protection is provided. The method comprises connecting a line protection device in series with an electric line. Further the method comprises sensing a value of electric current through an electric line by a current sensor of the line protection device. Further, the method comprises digital filtering of the value of the electric current by a digital filter circuit of the dine protection device. Further, the method comprises controlling a switch to interrupt flow of the electric current through the line depending on the digitally filtered value of the electric current. Further, the method comprises powering at least the digital filter circuit from at least one terminal used to connect the line protection device in series with the electric line.

According to further embodiments of the invention, other devices, systems, or methods may be provided. Such embodiments will be apparent from the following detailed description in connection with the accompanying drawings.

DETAILED DESCRIPTION

In the following, various embodiments will be described in detail with reference to the accompanying drawings. It should be noted that these embodiments serve only as examples and are not to be construed as limiting. For example, while embodiments with a plurality of features, other embodiments may comprise less features and/or alternative features. Furthermore, features from different embodiments may be combined with each other unless specifically noted otherwise.

Embodiments as illustrated in the following relate to protection of an electric line, in particular to protecting the electric line from being damaged by excessive current flow. The electric line may for example be a wire, cable, conductor strip, or a connector. In the illustrated examples, the electric line is protected by using a switch to interrupt current flow through the electric line before a damage of the electric line occurs. The switch is controlled depending on a digitally filtered value of the current through the electric line. The switch and electronics for controlling the switch may be part of a line protection device, e.g., in the form of an electronic fuse or in the form of a switch device supplemented with a line protection function.

Figure 1A:
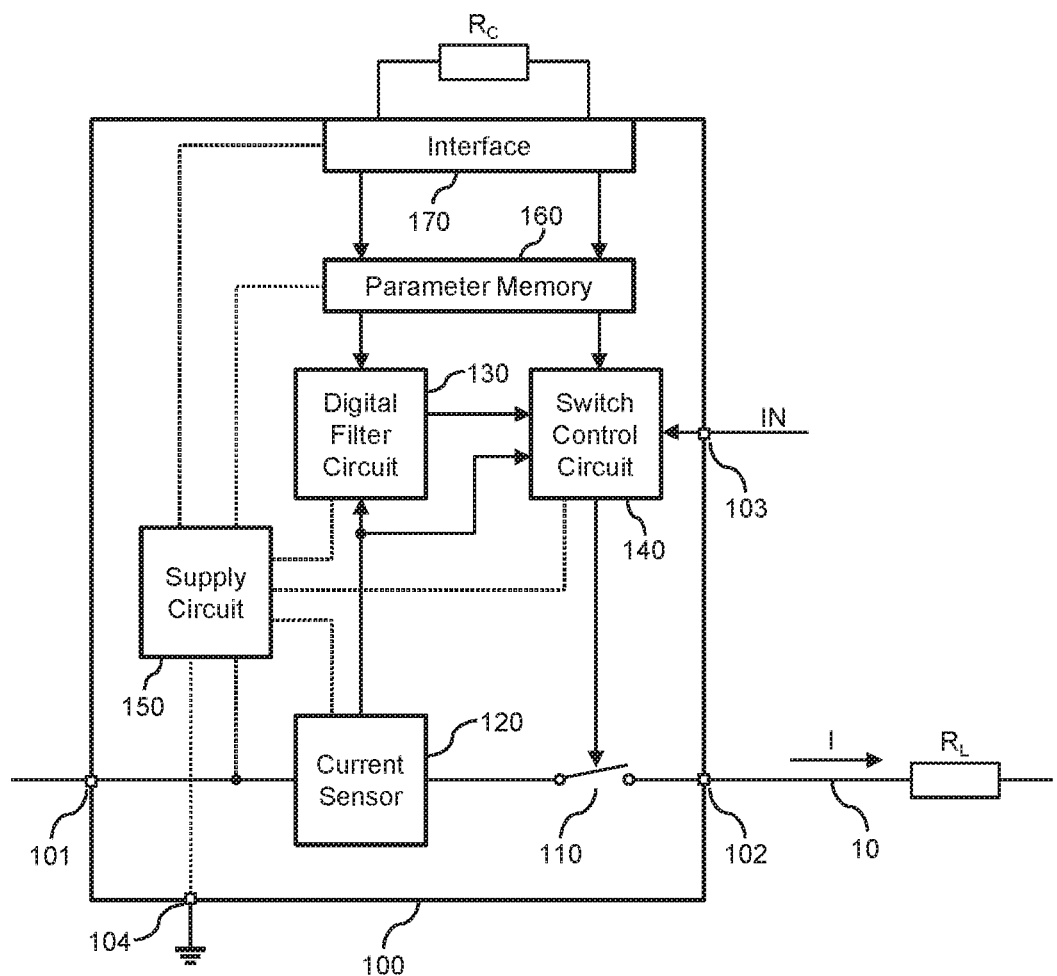
FIG. 1A schematically illustrates a line protection device according to an embodiment of the invention.

FIG. 1A schematically illustrates a line protection device 100 according to an embodiment. As illustrated, the line protection device 100 has two terminals 101, 102 which are used to connect the line protection device in series with an electric line 10 to be protected. The electric line 10 may for example be or include a wire, cable, conductor strip, a connector, or a combination thereof. In the illustrated example, the electric line 10 is connected to a load $R_L$. The load $R_L$ may for example include or be part of an electric motor, an electric lighting device, an electric heating or cooling device, or the like.

The line protection device 100 includes a switch 110, a current sensor 120, a digital filter circuit 130, and a switch control circuit 140. As further illustrated, the line protection device 100 may also include a parameter memory 160 and/or an interface 170.

The current sensor 120 is used to a sense a value of an electric current I flowing through the electric line 10. The current sensor 120 provides the sensed value of the electric current I to the digital filter circuit 130. The digital filter circuit 130 performs digital filtering of the signal representing the value of the electric current I and provides the digitally filtered value of the electric current I to the switch control circuit 140. The switch control circuit 140 controls the switch 110 depending on the digitally filtered value of the electric current I. Depending on the digitally filtered value of the electric current I, e.g., if the digitally filtered value of the electric current I exceeds a threshold, the switch control circuit 140 may control the switch 110 to interrupt flow of the electric current I through the electric line 10. The digital filtering of the value of the electric current I allows for triggering the interruption of the flow of the electric current I according to a time-current characteristic which suits the electric line 10 to be protected.

As further illustrated, the switch control circuit 140 may also receive one or more additional input signals and control the switch 110 also depending on the additional input signal(s). In the illustrated example, the additional input signals include the unfiltered value of the electric current I from the current sensor 120 and an input signal IN provided through a control input 103 of the line protection device 103. Based on the unfiltered value of the electric current I, the switch control circuit 140 may for example interrupt flow of the electric current I through the electric line 10 if the value of the electric current I exceeds a threshold. Depending on the input signal IN, the switch control circuit 140 may for example open or close the switch 110 in a state where neither the digitally filtered value of the electric current I nor the unfiltered value of the electric current I would trigger interruption of the flow of the electric current I through the electric line 10. In this way, the line protection device 100 may also be used as an externally controllable switch.

The supply circuit 150 is used to power components of the line protection device 100. Dotted lines in FIG. 1 schematically illustrate the powering of the components. For powering the components, the supply circuit 150 derives electric power from at least one of the terminals 101, 102 which are used to connect the line protection device 100 in series with the electric line 10. In the illustrated example the supply circuit 150 derives the electric power from a voltage applied at the terminal 101 and from a ground terminal 104 of the line protection device 100. However, it is noted that in a similar manner the supply circuit 150 could also derive the electric power from a voltage applied at the terminal 102 and/or from a voltage applied at the terminal 101 and a voltage applied at the terminal 102.

In the example of FIG. 1A, the supply circuit 150 is illustrated as powering substantially all components of the line protection device 100. However, it is noted that in other scenarios some of the illustrated components might not require powering by the supply circuit 150. For example, some components could be implemented by passive circuit elements and thus not require any powering. On the other hand, at least the digital filter circuit 130 is assumed to be implemented on the basis of active circuit elements and thus powered by the supply circuit 150.

The parameter memory 160 may be used for storing one or more filter parameters of the digital filter circuit 130 and/or one or more control parameters of the switch control circuit 140. For example, the digital filtering performed by the digital filter circuit 130 could involve calculation of a polynomial function, and the filter parameters could define at least one polynomial coefficient of the polynomial function. Further, the digital filtering performed by the digital filter circuit 130 could involve low-pass filtering, and the filter parameters could define a cut-off frequency of said low-pass filtering. Further, the digital filtering performed by the digital filter circuit 130 could involve high-pass filtering, and the filter parameters could define a cut-off frequency of said high-pass filtering. The control parameters of the switch control circuit 140 could for example define one or more of the above-mentioned thresholds.

At least a part of the filter parameter(s) and/or control parameter(s) may be preconfigured in the parameter memory 160, e.g., as part of manufacturer settings. However, it is also possible to utilize the interface 170 to configure the filter parameter(s) and/or control parameter(s). For example, the interface 170 could be used to select between different parameter sets stored in the memory.

In the illustrated example, the interface 170 is provided with terminals for connecting an external configuration resistor $R_c$, and the value of the external configuration resistor $R_c$ is used for indicating which of the parameter sets is to be selected.

As an alternative or in addition to using the external configuration resistor $R_c$, it would also be possible to provide the interface 170 with one or more mechanical switch elements and to use the switch settings to indicate which of the parameter sets is to be selected. Still further, it would be possible to provide the interface 170 with one or more data lines and to use the data lines to indicate which of the parameter sets is to be selected and/or to transfer the filter parameter(s) and/or control parameter(s) to the parameter memory 160. In this respect, it is also noted that for implementing a data line, the interface could be equipped with one or more dedicated data line terminals. However, it is also possible to reuse one or more other terminals of the line protection device 100 to implement a data line, e.g., one or more of the terminals 101, 102, 103. In the latter case, a data signal which is transferred via the data line could be modulated onto other signals applied at the reused terminal(s) 101, 102, 103.

Figure 1B:
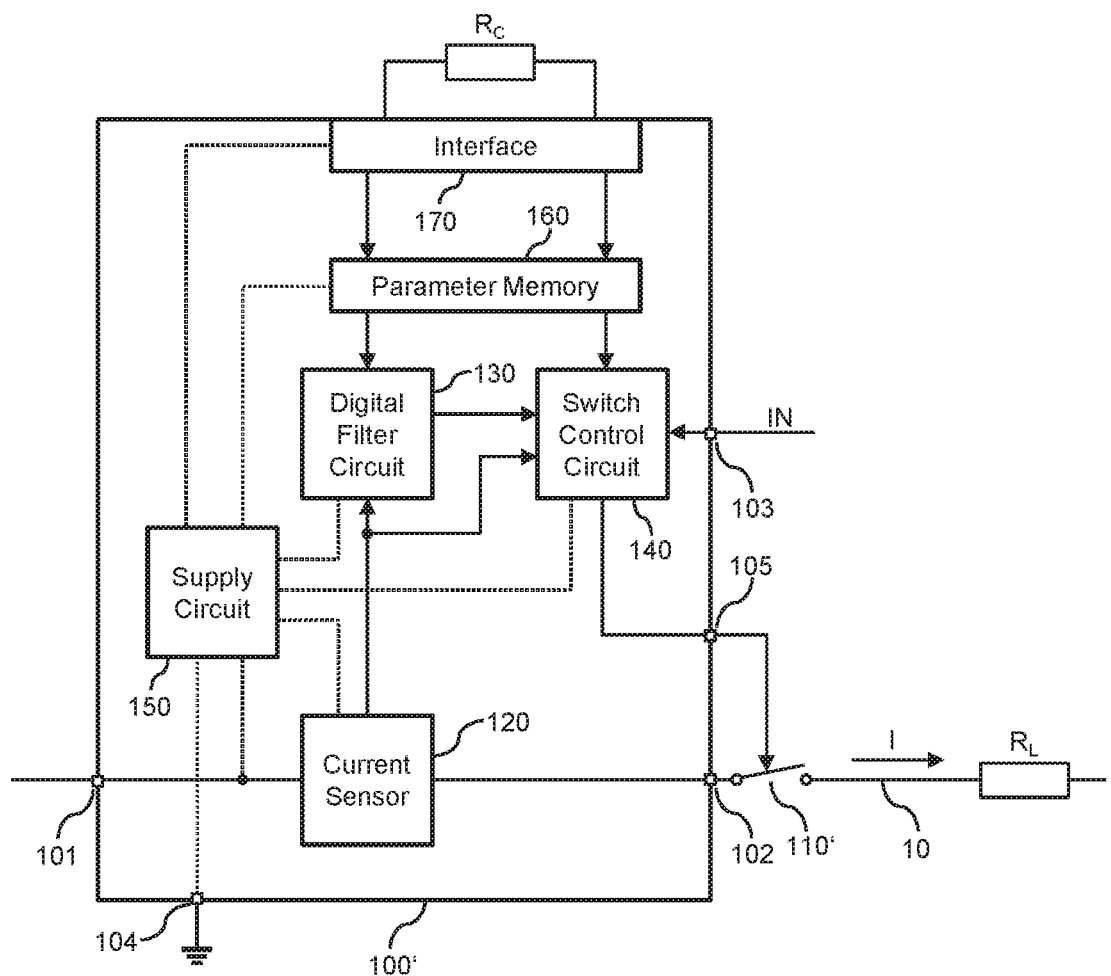
FIG. 1B schematically illustrates a line protection device according to a further embodiment of the invention.

In the example of FIG. 1A it was assumed that the switch 110 is part of the line protection device 100. However, it is also possible that the switch 110 is an external component. FIG. 1B illustrates a corresponding embodiment of a line protection device 100'.

The line protection device 100' is generally similar to the line protection device 100, and components of the line protection device 100' which correspond to those of the line protection device 100 have been designated by the same reference numerals. For further details concerning these components, reference is made to the description with respect to FIG. 1A.

In the case of the line protection device 100', the switch control circuit 140 provides a control signal to an external switch 110'. The line protection device 100' and the external switch 110' may be part of the same electronics package. Alternatively, the line protection device 100' and the external switch 110' could be provided as separate electronic packages.

In the example of FIG. 1B, the line protection device 100' and the external switch 110' are connected in series with the electric line 10 to be protected, using the terminals 101, 102 of the line protection device 100'. In this way, the electric current I through the electric line 10 can be sensed by the current sensor 120 of the line protection device 100'.

For providing the control signal to the external switch 110', the line protection device 100' includes an output terminal 105. The switch control circuit 140 of the line protection device 100 controls the switch 110' in the same way as explained above for the switch 110 of the line protection device 100. That is to say, the switch 110 is controlled depending on the digitally filtered value of the electric current I.

Figure 2A:
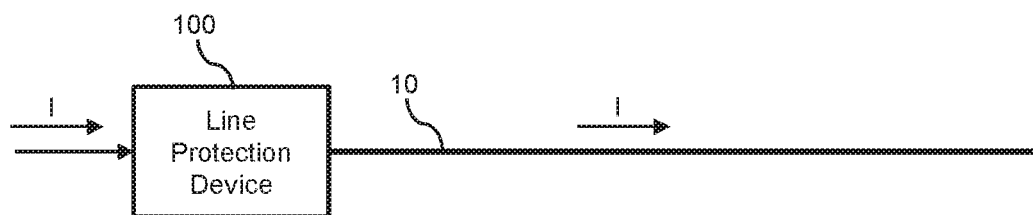
FIGS. 2A, 2B, 2C, and 2D schematically illustrate various scenarios in which an electric line is protected according to an embodiment of the invention.
Figure 2B:
Figure 2C:
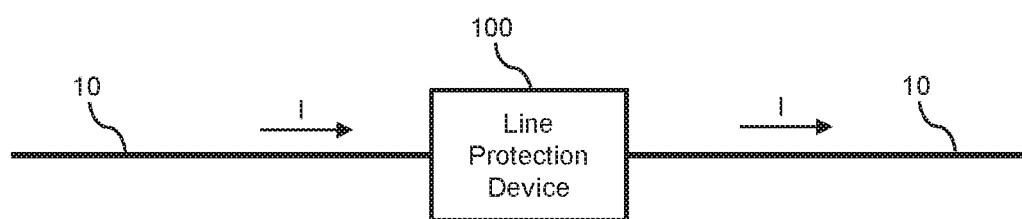
Figure 2D:
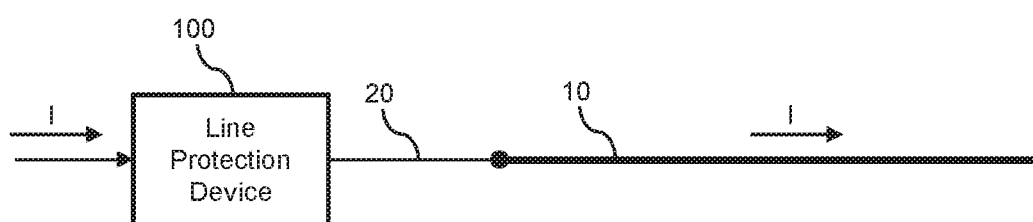

FIGS. 2A, 2B, 2C, and 2D schematically illustrate various arrangements of coupling the line protection device 100 to the electric line 10. As can be seen, in each of these arrangements the line protection device 100 is connected in series with the electric line 10. In the arrangement of FIG. 2A, the line protection device 100 is connected to one end of the electric line 10, and in the arrangement of FIG. 2B, the line protection device 100 is connected to the other end of the electric line 10. In the arrangement of FIG. 2C, the line protection device 100 is connected between two segments of the electric line 10. In the arrangement of FIG. 2D, the line protection device 100 is connected indirectly via an intermediate conductor element 20 to the electric line 10. In each of these arrangements, the line protection device 100 can be powered like explained above, by deriving power from at least one of the terminals 101, 102 used to connect the line protection device 100 in series with the electric line 10. In each of these arrangements, the line protection device 100 may act as a replacement of a conventional fuse.

The line protection device 100' can be used in similar arrangements as illustrated in FIGS. 2A, 2B, 2C, and 2D. However, it is noted that in this case the line protection device 100' and the external switch 110' could be arranged at different locations. For example, the line protection device 100' could be arranged at one end of the electric line 10, like illustrated in FIG. 2A or 2B, while the external switch 110' is arranged at the other end of the electric line 10 or is inserted between two segments of the electric line 10.

As mentioned above, the digital filtering performed by the digital filter circuit 130 may be used to trigger the interruption of the flow of the electric current I according to a time-current characteristic which suits the electric line 10. This will be further explained in the following.

Figure 3:
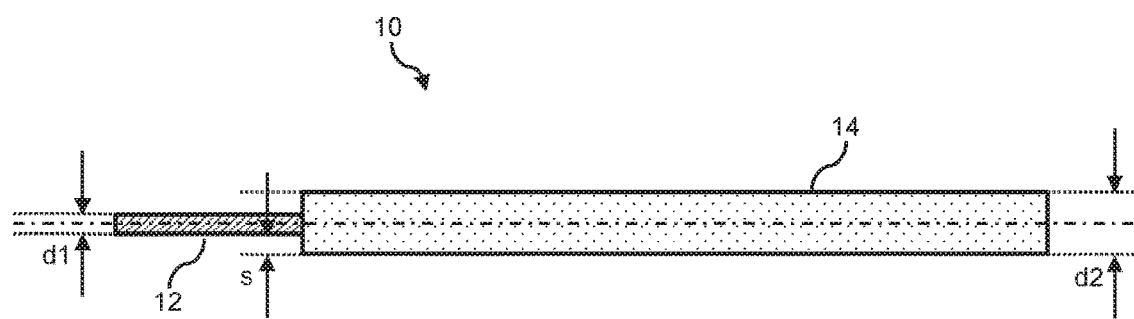
FIG. 3 schematically illustrates an electric line to which protection according to an embodiment of the invention may be applied.

FIG. 3 further illustrates exemplary properties of the electric line 10. In the illustrated example it is assumed that the electric line 10 is an isolated wire having a cylindrical geometry with an inner conductor 12 covered by an insulator layer 14. The inner conductor 12, which may be formed by stranded or solid wire, has a diameter d1. The overall diameter of the wire is d2. A thickness s of the insulator layer 14 is denoted by s. The robustness of the electric line 10 depends on these geometric properties and also on constituent materials of the electric line 10, such as material of the conductor 12 and material(s) of the insulator layer 14. A temperature limit $T_L$ may be defined for the electric line 10, e.g., as a temperature which should not be exceeded in order to prevent damaging of the electric line 10.

Figure 4:
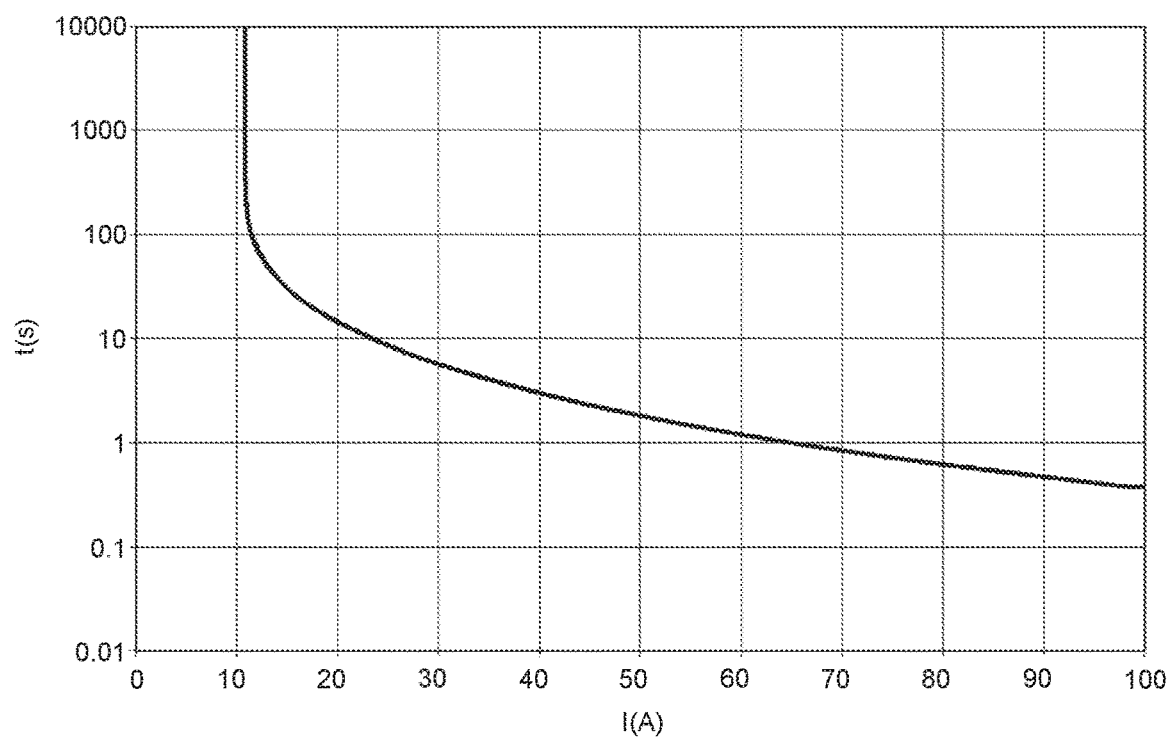
FIG. 4 shows an exemplary time-current characteristic of the electric line.

When the electric current I flows through the electric line 10, heat is generated in the electric line 10. The resulting temperature of the electric line 10 depends on various parameters, such as the above-mentioned geometric properties of the electric line 10. Further, the resulting temperature also depends on the constituent materials of the electric line 10. Further, the resulting temperature also depends on the value of the electric current I, time duration of current flow through the electric line 10, and on ambient temperature. As a general rule, a higher value of the electric current I causes a higher resulting temperature. Similarly, a higher duration of the current flow would cause a higher resulting temperature. This may be considered by representing the robustness of the electric line 10 by a time-current characteristic which, for a given ambient temperature, shows the time t to reach the temperature limit $T_L$ of the electric line 10 as a function of the value of the electric current I flowing through the electric line 10. FIG. 4 shows an example of such time-current characteristic. As can be seen, with increasing value of the electric current I there is a shorter allowed time of current flow through the electric line 10 until reaching the temperature limit $T_L$. For low values of the electric current I, the current may practically flow for an infinite time without reaching the temperature limit $T_L$ being reached.

To efficiently protect the electric line 10, it is desirable that the interruption of the flow of the electric current I through the electric line 10 is triggered according to a characteristic which suits the time-current characteristic of the electric line 10. Specifically, efficient protection may be achieved by triggering the interruption of the flow of the electric current I through the electric line 10 according to a time-current characteristic which is similar to the time-current characteristic of the electric line 10, but is shifted by a margin to towards lower currents and shorter times. This has the effect that the flow of the electric current I through the electric line 10 will be interrupted already before damage of the electric line 10 occurs. In addition, it is also desirable to add overcurrent protection by interrupting the flow of the electric current I through the electric line 10 when the value of the electric current I exceeds a certain maximum threshold.

Figure 5:
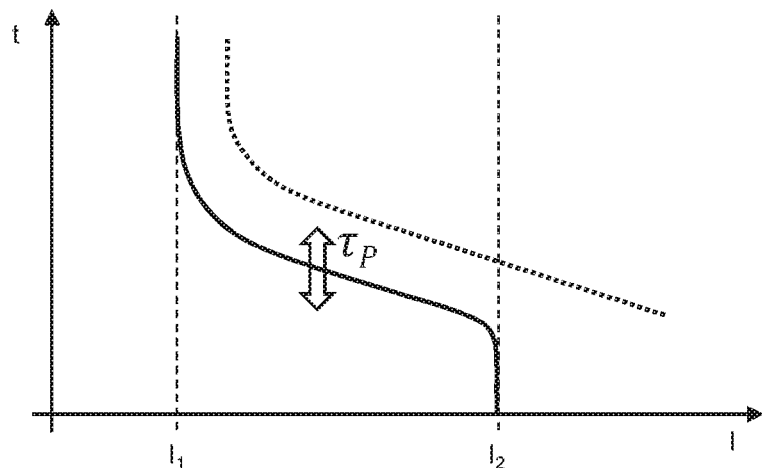
FIG. 5 schematically illustrates a configurable time-current characteristic of a line protection device according to an embodiment of the invention.

In the line protection device 100, 100', the time-current characteristic for triggering the interruption of the flow of the electric current I is implemented by the digital filtering performed by the digital filter circuit 130. The interruption in response to exceeding the maximum current threshold may be implemented by the switch control circuit 140. FIG. 5 schematically illustrates the resulting combined characteristic for interruption of the flow of the electric current I through the electric line 10. For comparison, FIG. 5 illustrates the time-current characteristic of the electric line 10 by a dotted line. As can be seen, the time-current characteristic provided by the line protection device 100, 100' can be regarded as having three branches: a first substantially vertical branch defined by a lower current limit $I_1$, a second substantially vertical branch defined by an upper current limit $I_2$, and a substantially horizontal branch which connects the two substantially vertical branches. Below the lower current limit $I_1$, also referred to as maximum permanent current, the electric current I can flow for infinite time without triggering interruption of the flow of the electric current I. Above the upper current limit $I_2$, which is also referred to as "trip current", interruption of the flow of the electric current I is triggered immediately, irrespective of the duration of current flow. A time position of the substantially horizontal branch represents a triggering speed or delay, denoted by $\tau_P$.

Figure 6:
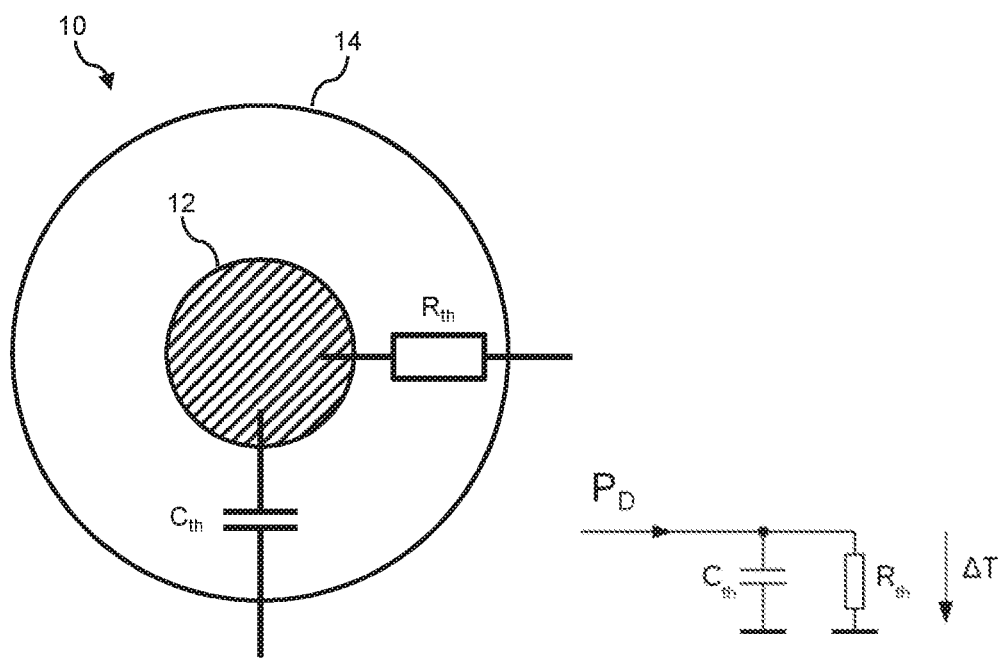
FIG. 6 illustrates a thermal model of an electric line.

FIG. 6 illustrates a thermal model of the electric line 10. Based on this thermal model, it can be seen that the digital filtering of the value of the electric current through the electric line 10 can be used to efficiently estimate the temperature of the electric line 10 from the value of the electric current I and thereby implement the a time-current characteristic as explained in connection with FIG. 5.

In a cross-sectional view of the electric line 10, FIG. 6 shows that heating of the electric line 10 can be modelled by defining a thermal resistance $R_{th}$ and a thermal capacitance $C_{th}$. The thermal resistance $R_{th}$ describes an ability of conducting heat from the inner conductor 12 to an ambient medium surrounding the electric line 10, e.g., to ambient air. The thermal resistance $R_{th}$ typically depends on the thickness of the insulator layer 14, on the material(s) used in the conductor 12 and in the insulator layer 14, and also on the diameter $d_1$ of the conductor 12 and the diameter $d_2$ of the electric line 10. The thermal capacitance $C_{th}$ parametrizes an ability of storing heat in the electric line 10. Also the thermal capacitance $C_{th}$ depends on the thickness of the insulator layer 14, on the material(s) used in the conductor 12 and in the insulator layer 14, and also on the diameter $d_1$ of the conductor 12 and the diameter $d_2$ of the electric line 10.

Further, FIG. 6 also shows an equivalent thermal circuit which can be used to model heating of the electric line 10 due to the electric current flowing through the electric line 10. As can be seen, the heating of the electric line 10 can be modelled in terms of a circuit in which a thermal dissipation power generated in the conductor 12 is applied to a low-pass filter circuit defined by the thermal resistance $R_{th}$ and the thermal capacitance $C_{th}$. The static behavior of the electric line 10 in response to an electric current equal to the first current limit I1 can be described by the following equations:

$$P_{Dm} = k_1 I_1 + k_2 I_1^2 \quad (1)$$

$$P_{Dm} = k_3 \Delta T = k_3 (T_L - T_A), \quad (2)$$

where TL denotes the temperature limit defined for the electric line 10 and $T_A$ denotes the ambient temperature of the electric line 10. The coefficients $k_1$, $k_2$, $k_3$ depend on the properties of the electric line 10.

The dynamic behavior of the electric line 10 in response to an electric current above the first current limit I1 can in turn be described by the following equations:

$$\tau_L = R_{th} C_{th} \quad (3)$$

$$t_S = -\tau_L \ln(1 - k_3 \Delta T/(k_1 I + k_2 I^2)), \quad (4)$$

where $t_S$ denotes the time required for heating the electric line 10 from the ambient temperature $T_A$ to the temperature limit $T_L$.

Accordingly, the thermal behavior of the electric line 10 can be described in terms of two parameters: The current I1 which causes maximum heating of the electric line 10 under static conditions, and a time constant $\tau_P$ which is defined by the thermal resistance $R_{th}$ and the thermal capacitance $C_{th}$. More specifically, the thermal behavior of the electric line 10 in response to the electric current I flowing through the electric line 10 can be modelled by calculating a polynomial function of the electric current I and subjecting the values of the polynomial function to low-pass filtering with a time constant $\tau_L$. In the line protection device 100, 100', the time-current characteristic for triggering interruption of the flow of the electric current I through the electric line 10 can be configured to mimic this thermal behavior, by performing digital filtering in the digital filter circuit 130 which involves calculating a polynomial function of the electric current I according to:

$$P = k_1 I + k_2 I^2 \quad (5)$$

and then subjecting the output of the polynomial function to low-pass filtering with a time constant $\tau_P$. The output of the low-pass filtering represents a temperature increase with respect to the ambient temperature $T_A$. The time constant $\tau_P$ may be selected slightly lower than the time constant $\tau_L$ estimated for the electric line 10, to ensure that the interruption of the flow of the electric current is triggered before the electric line 10 can reach the temperature limit $T_L$.

Assuming that the ambient temperature $T_A$ is not available as a measured input parameter, the ambient temperature $T_A$ can be taken into account in terms of a worst-case consideration, by assuming a worst-case ambient temperature $T_{WC}$ which will not be exceeded under typical operating conditions. The maximum permanent current, i.e., the lower current limit $I_1$, can then be used as a basis for estimating a maximum temperature $T_{LS}$ of the electric line 10 under steady conditions. For example, the maximum temperature $T_{LS}$ of the electric line 10 under steady conditions could be estimated as $$T_{LS} = T_{WC} + \frac{k_2}{k_3} I_1^2. \quad (6)$$

Figure 7A:
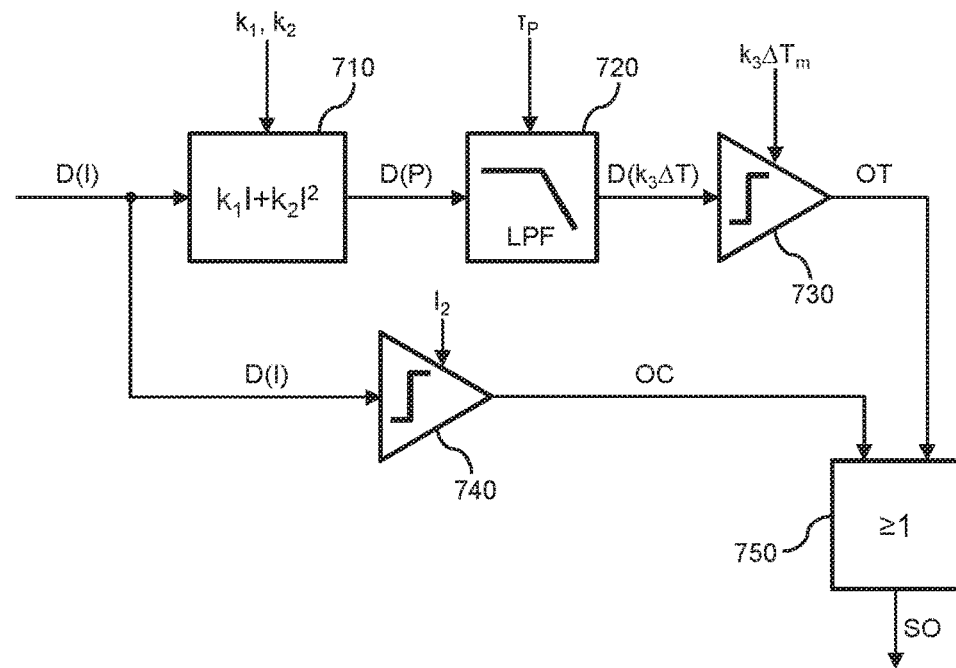
FIG. 7A further illustrates a digital filter circuit and switch control circuit of the line protection device.

In view of the above, digital filtering of the value of the electric current I by the digital filter circuit 130 and logic evaluation of the digitally filtered value of the electric current I by the switch control circuit 140 could be implemented as illustrated in FIG. 7A.

FIG. 7A shows a block diagram for illustrating an example of digital filtering operations performed by the digital filter circuit 130 on the basis of a digitized value D(I) of the electric current I through the electric line 10. Further, FIG. 7A shows an example of logic operations performed by the switch control circuit 140.

In the example of FIG. 7A, the digital filtering operations include calculation of a polynomial function in filter block 710 and low-pass filtering in filter block 720. The logic operations include a comparison in logic block 730, a comparison in logic block 740, and a logic or operation in logic block 750.

The filter block 710 receives the digitized value D(I) of the electric current I and digitally calculates a polynomial function according to equation (5). As shown by equation (5), the polynomial function may be a second order polynomial function with non-zero coefficients $k_1$ and $k_2$ for a linear part and a quadratic part of the polynomial function. However, in some implementations it would also be possible to neglect the linear part and have a non-zero coefficient $k_2$ only for the quadratic part. However, having a non-zero coefficient $k_1$ also for the linear part may allow for more accurately modelling that conductivity of the conductor 12 of the electric line 10 depends on temperature.

The output of the polynomial function is provided as a digital value D(P) to the filter block 720. The filter block 720 performs digital low-pass filtering of the output D(P) of the polynomial function. For this purpose, the filter block 720 may for example include a first order digital low-pass filter. However, utilization of a higher order digital low-pass filter, e.g., second or third order, is possible as well. The output of the filter block 720 represents the estimated temperature increase $\Delta T$ of the electric line 10, multiplied by the coefficient $k_3$. The output of the filter block 720 is provided as a digital value $D(k_3 \Delta T)$ to the logic block 730.

The logic block 730 receives the output $D(k_3 \Delta T)$ of the filter block 720, i.e., the digitally filtered value of the electric current I, and compares the output $D(k_3 \Delta T)$ to a first threshold to decide whether the estimated temperature of the electric line 10 exceeds the temperature limit $T_L$. Accordingly, the first threshold depends on the temperature limit $T_L$. In addition the first threshold may depend on the ambient temperature $T_A$, e.g., in terms of an offset from the temperature limit $T_L$. As explained in connection with equation (6) this offset may also be estimated on the basis of a worst case consideration from the maximum permanent current through the electric line 10.

If the logic block 730 decides that the estimated temperature of the electric line 10 exceeds the temperature limit $T_L$, the logic block 730 sets an overtemperature signal OT to a digital value "1". If the logic block 730 decides that the estimated temperature of the electric line 10 does not exceed the temperature limit $T_L$, the logic block 730 sets the overtemperature signal OT to a digital value "0".

The logic block 740 receives the digitized value D(I) of the electric current I, i.e., the unfiltered value of the electric current I and compares the value of the electric current I to a second threshold to decide whether the value of the electric current I exceeds the upper current limit $I_2$, i.e., the trip current. The second current limit $I_2$ may for example be set in view of protecting the line protection device 100, 100' itself from dissipating to much energy. Further, the second current limit $I_2$ may be set and also in view of protecting other devices coupled to the electric line 10 from excessively high current peaks or in view of avoiding a supply voltage breakdown caused by such excessive current peak.

If the logic block 740 decides that the value of the electric current I through the electric line 10 exceeds the upper current limit $I_2$, the logic block 740 sets an overcurrent signal OC to a digital value "1". If the logic block 740 decides that the value of the electric current I through the electric line 10 does not exceed the upper current limit $I_2$, the logic block 740 sets the overcurrent signal OC to a digital value "0".

The logic block 750 receives the overtemperature signal OT and the overcurrent signal OC and combines these two signals by a logic or operation. That is to say, if at least one of the overtemperature signal OT and the overcurrent signal OC has the digital value "1", the logic block 750 sets a switch off signal SO to a digital value "1". If none of the overtemperature signal OT and the overcurrent signal OC has the digital value "1", the logic block 750 sets the switch off signal SO to a digital value "0". The switch off signal SO is then used for triggering interruption of the flow the electric current I through the electric line 10. Specifically, if the switch off signal SO is set to the digital value "1", the switch control circuit 140 interrupts the flow of the current I by opening the switch 110. If the switch off signal SO is set to the digital value "0", the switch control circuit 140 may keep the switch 110 closed. However, depending on other criteria the switch control circuit 140 may also open the switch when the switch off signal SO is set to the digital value "0", e.g., if the above-mentioned external input signal IN indicates that the switch 110 is to be opened.

Figure 7B:
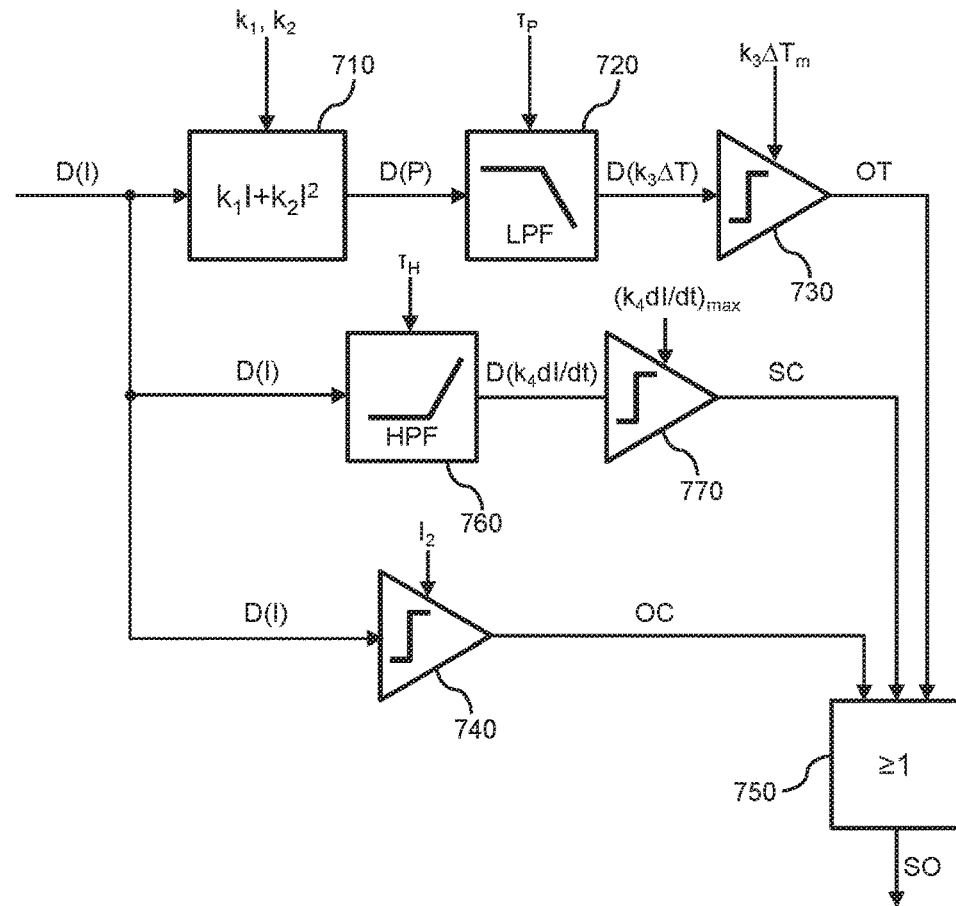
FIG. 7B illustrates a further example of a digital filter circuit and switch control circuit of the line protection device.

In the example of FIG. 7A the digital filtering operations performed by the digital filter circuit 130 include calculation of a polynomial function and low-pass filtering. However, it is noted that the digital filter circuit 130 may also implement other types of digital filtering operations. FIG. 7B shows a block diagram for illustrating a corresponding example in which the digital filtering operations performed by the digital filter circuit 130 also include high-pass filtering. Further, FIG. 7B shows an example of further logic operations performed by the switch control circuit 140.

Also in the example of FIG. 7B the digital filtering operations include calculation of a polynomial function in filter block 710 and low-pass filtering in filter block 720. The logic operations include a comparison in logic block 730, a comparison in logic block 740, and a logic or operation in logic block 750. Details concerning the operation of the filter blocks 710 and 720 and the logic blocks 730, 740, and 750 can be taken from the above description in connection with FIG. 7A. In the example of FIG. 7B, the digital filtering operations additionally include high-pass filtering in filter block 760, and the logic operations additionally include a comparison in logic block 770.

The filter block 760 receives the digitized value D(I) of the electric current I and performs digital high-pass filtering of the value D(I). For this purpose, the filter block 760 may for example include a first order digital high-pass filter. However, utilization of a higher order digital high-pass filter, e.g., second or third order, is possible as well. An output of the filter block 760 represents an estimate of the time derivative dI/dt of the value of the electric current I through the line 10, multiplied by a coefficient $k_4$. The output of the filter block 760 is provided as a digital value $D(k_4 \, dI/dt)$ to the logic block 770.

The logic block 770 receives the output $D(k_4 \, dI/dt)$ of the filter block 760, i.e., the estimate of the time-derivative of the value of the electric current I, and compares the output $D(k_4 \, dI/dt)$ to a third threshold $(k_4 \, dI/dt)_{max}$ to decide whether there is an excessive increase of the electric current I through the electric line 10. The excessive increase of the electric current I may be indicative of a short-circuit on the electric line 10.

If the logic block 770 decides that there is an excessive increase of the electric current I through the electric line 10, the logic block 770 sets a short-circuit signal SC to a digital value "1". Otherwise, the logic block 770 sets the short circuit signal SC to a digital value "0".

In the example of FIG. 7B, the logic block 750 receives the overtemperature signal OT, the overcurrent signal OC, and the short circuit signal SC and combines these three signals by a logic or operation. That is to say, if at least one of the overtemperature signal OT, the overcurrent signal OC, and the short circuit signal SC has the digital value "1", the logic block 750 sets a switch off signal SO to a digital value "1". If none of the overtemperature signal OT, the overcurrent signal OC, and the short circuit signal SC has the digital value "1", the logic block 750 sets the switch off signal SO to a digital value "0". Similar to the example of FIG. 7A, the switch off signal SO is then used for triggering interruption of the flow the electric current I through the electric line 10. Specifically, if the switch off signal SO is set to the digital value "1", the switch control circuit 140 interrupts the flow of the current I by opening the switch 110. If the switch off signal SO is set to the digital value "0", the switch control circuit 140 may keep the switch 110 closed. However, depending on other criteria the switch control circuit 140 may also open the switch when the switch off signal SO is set to the digital value "0", e.g., if the above-mentioned external input signal IN indicates that the switch 110 is to be opened.

In the example of FIG. 7B, the processing of the digital value D(I) by high-pass filtering in the filter block 760 and comparison to the threshold value in the logic block 770 allows for also interrupting the flow of the electric current I through the electric line 10 when a short circuit on the electric line 10 causes an abrupt increase of the value of the electric current I. In this case, the interruption of the flow of the electric current I can be triggered early, already before there is significant heating of the electric line 10 and before the upper current limit $I_2$ is reached. In this way, protection of the electric line 10 in short-circuit scenarios can be further improved.

It is noted that in a variant of the example of FIG. 7B the output D(P) of the filter block 710 could be used instead of the digital value D(I) as the input of high-pass filtering in filter block 760. In still another variant, the low-pass filtering of filter block 720 and the high-pass filtering of filter block 760 could be implemented by the same filter block, e.g., by providing the filter block 720 with a band-stop filter characteristic. In the latter case, the output of the filter block 720 could be provided both to the logic block 730 and to the logic block 770.

Figure 8:
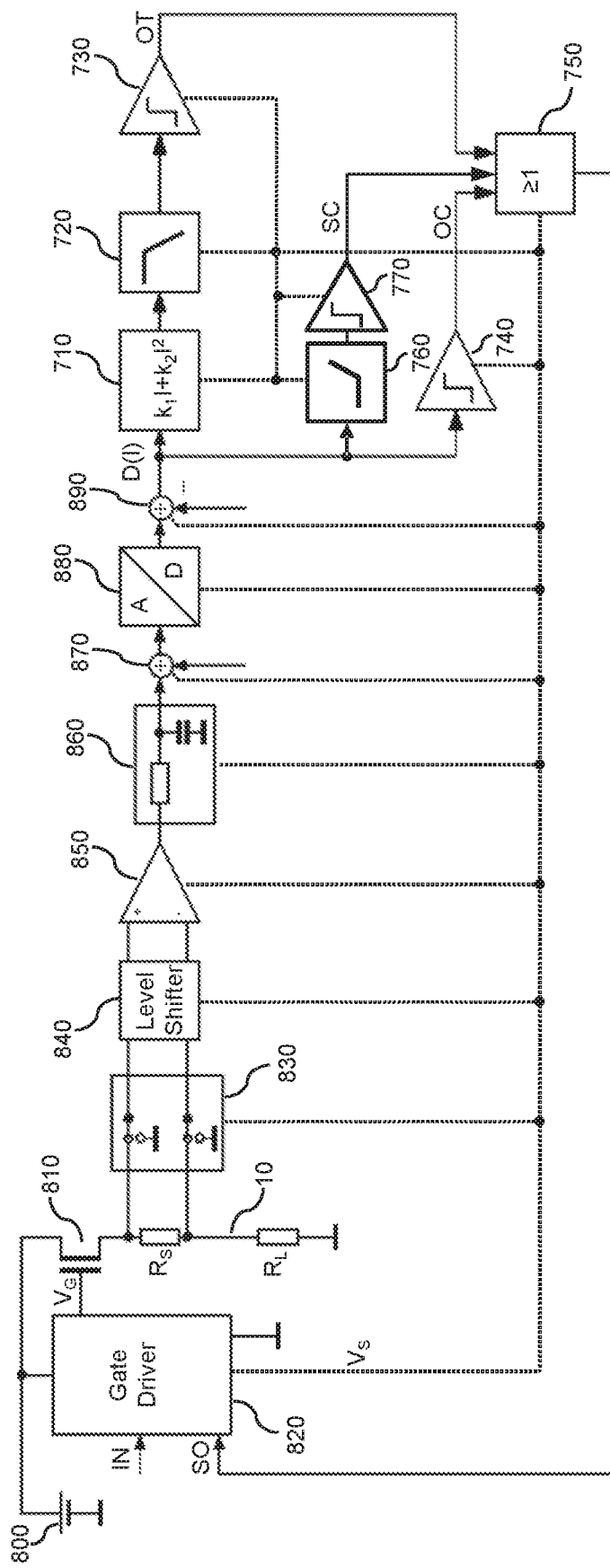
FIG. 8 shows an overall diagram of the line protection device with the digital filter circuit and switch control circuit of FIG. 7B.

FIG. 8 shows an overall block diagram for illustrating how the above-mentioned functionalities of the line protection device 100, 100' can be implemented by electronic circuit elements. Similar to FIG. 1, FIG. 8 uses dotted lines to schematically illustrate powering of components of the line protection device 100, 100'.

In the example of FIG. 8, the line protection device 100, 100' and the line 10 to be protected are supplied from a voltage source 800, e.g., a battery. The line protection device 100, 100' includes a transistor 810. The transistor may implement the internal switch 110 of FIG. 1A or the external switch 110 of FIG. 1B. The transistor 810 may for example be an MOSFET (Metal Oxide Semiconductor Field Effect) transistor, e.g., a power MOSFET based on a DMOS technology (Double Diffused Metal Oxide) or VMOS (V-grooved Metal Oxide Semiconductor) technology. However, other transistor types could be used as well. The voltage source 800, the transistor 810, the electric line 10 to be protected, and the load $R_L$ are connected in series. Accordingly, if the transistor 810 is in a conducting state, the electric current I through the electric line 10 will also flow through the transistor 810. By bringing the transistor 810 into a non-conducting state, the flow of the electric current I through the electric line 10 can be interrupted.

Further, the line protection device 100, 100' includes a gate driver 820 which generates a gate signal $V_G$ for controlling the transistor 810 to change between the conducting state and the non-conducting state. The gate driver 820 is powered by an input voltage provided by the voltage source 800. Accordingly, the same terminals which are used to connect the transistor in series with the voltage source 800 can also be used to power the gate driver 820.

As illustrated by the dotted lines, the gate driver 820 also supplies power to other components of the line protection device 100, 100'. For example, the gate driver 820 could derive one or more supply voltages $V_S$ from the input voltage provided by the voltage source 800 and distribute the supply voltage(s) $V_S$ to the other components as illustrated by the dotted lines.

In the illustrated example, it is assumed that the transistor 810 is of a "normally off" type. That is to say, the gate signal $V_G$ needs to be actively generated with a certain voltage level, above a threshold voltage of the transistor 810, to bring the transistor 810 into the conducting state. In this way, a the line protection device 100, 100' can be operated in a fail-safe manner, by ensuring that in cases where the line protection device 100, 100' is not active due to a lack of power, the transistor 810 is in the non-conducting state and here can be no electric current I through the electric line 10 to be protected.

In the example of FIG. 8, the line protection device 100, 100' further includes a shunt resistor $R_S$ and a voltage sensor 830. The shunt resistor $R_S$ is connected in series between the transistor 810 and the electric line 10. The voltage sensor 830 senses a voltage level on each terminal of the shunt resistor $R_S$, and these voltage levels are provided through a level shifter 840 to a measurement amplifier 850. The measurement amplifier 850 provides a single-ended output voltage which represents the voltage across the shunt resistor $R_S$ and thus the value of the electric current I through the electric line 10.

The output voltage of the measurement amplifier 850 is fed to an anti-aliasing filter 860. The anti-aliasing filter 860 may for example have a low-pass characteristic. The output of the anti-aliasing filter 860 is supplied to an adder 870 which adds a half-signal range offset to its input signal. The output signal of the adder 870 is then supplied to an analog-digital converter 880 for analog-to-digital conversion. A digital output of the analog-digital converter 880 is then supplied to a further adder 890 which digitally subtracts the half-range signal offset from the digital output of the analog-digital converter 880. By adding the half-signal range offset before analog-to-digital conversion and subtracting the half-signal range offset after analog-to-digital conversion, conversion of the value of the electric current I into a digital value can be supported for both polarities of the electric current I.

In addition, subtraction of the offset after analog-to-digital conversion can also be used for correcting other offsets. For example, due to manufacturing tolerances the voltage sensor 830, the level shifter 840, the measurement amplifier 850, the anti-aliasing filter 860, or the adder 870 may introduce an offset to the output of the analog-digital converter 880. This offset can be estimated by short-circuiting the inputs of the voltage sensor 830 and measuring the offset in terms of the resulting digital output of the analog-to-digital converter 880. During normal operation of the line protection device 100, 100', the measured offset can then be additionally subtracted by the adder 890.

In combination, the shunt resistor $R_S$, the voltage sensor 830, the level shifter 840, the measurement amplifier 850, the anti-aliasing filter 860, the adder 870, the analog-to-digital converter 880, and the adder 890 may implement the current sensor 120. In the illustrated example, the current sensor 120 would thus be configured to sense the value of the electric current I through the electric line 10 and output a digital value representing the value of the electric current I, such as the above-mentioned digital value D(I). However, it is noted that other implementations of the current sensor 120 could be used as well. For example, the current sensor 120 could also be implemented completely on the basis of analog circuitry, and analog-to-digital conversion could be performed by an input stage of the digital filter circuit 140.

In the example of FIG. 8, it is assumed that the digital value D(I) representing the value of the electric current I is then processed as explained in connection with FIG. 7B to generate the switch of signal SO. That is to say, the digital value D(I) is processed by the filter blocks 710, 720, and 760, and the logic blocks 730, 740, 750, and 770. However, it is noted that the filter block 760 and the logic block 770 could also be omitted and the switch off signal SO could be generated as explained in connection with FIG. 7A.

The switch of signal SO is supplied to the gate driver 820 and used to trigger interruption of the flow of the electric current I when the switch of signal SO is set to the digital value "1". In the example of FIG. 8 this means that in response to the switch off signal SO having the digital value "1", the gate driver 820 will stop generating the gate signal $V_G$ with the required voltage level to bring the transistor 810 into the conducting state.

In the example of FIG. 8, the gate driver 820 also receives the external input signal IN. While the switch off signal SO has the digital value "0", the gate driver 820 may generate the gate signal $V_G$ to switch the transistor 810 between the conducting state and the non-conducting state, so that the line protection device 100 can also be used for implementing an externally controllable switch. Here, it is noted that when the switch off signal SO has the digital value "1", the gate driver 820 will always bring the transistor 810 into the non-conducting state and interrupt the flow of the electric current I. In this way, it can be avoided that the transistor 810 is brought back into the conducting state before the electric line 10 has sufficiently cooled down. After triggering interruption of the flow of the electric current I by the switch of signal SO, the switch of signal SO can be latched by the gate driver 820 so that the transistor 810 remains in the non-conducting state until the line protection device 100, 100' is reset. Resetting of the line protection device 100, 100' can for example require applying a specific signal sequence to the external input signal IN or disconnecting the line protection device 100, 100' from the voltage source 800. In some cases, the line protection device 100, 100' could also be automatically reset by latching the switch of signal SO only for a limited time.

The above-mentioned parameter memory 160 may include various parameters for configuring the operation of the line protection device 100, 100' as explained in connection with FIGS. 7 and 8. These parameters may be stored as part of manufacturer settings, e.g., during end-testing of the line protection device 100, 100'. However, it is also possible that at least some of these parameters are configurable by a user of the line protection device 100, 100', e.g., using the above-mentioned interface 170.

The parameter memory 160 may include values for the coefficients $k_1$, $k_2$, $k_3$, $k_4$, the time constant $\tau_P$ of low-pass filtering in the filter block 720, and/or the time constant $\tau_H$ of high-pass filtering in the filter block 760. Further, the parameter memory 160 may define the threshold values to be used by the logic blocks 730 and 740. In the case of the logic block 730, the first threshold value could for example be defined in terms of a maximum allowable temperature increase $\Delta T_m$, in terms of $k_3 \Delta T_m$, or in terms of $k_3(T_L - T_A)$. However, the first threshold value could also be defined in terms of the temperature limit $T_L$ and a worst-case estimate of the ambient temperature $T_A$ based on the maximum permanent current $I_1$. Still further, the parameter memory 160 could also include different options for the first threshold value, which could be selected according to a measurement of the ambient temperature $T_A$ or according to an estimated range of the ambient temperature $T_A$.

In some scenarios, the linear term of the polynomial function implemented by the filter block 710 can be neglected. In this case, the digital processing performed by the filter block 710 and 720 can be simplified. In particular, the filter block 710 could then be configured to merely perform squaring of the digital value D(I), and the remaining coefficients $k_2$ and $k_2$ could be combined to a single coefficient $k=k_3/k_2$. The first threshold value could then be defined in terms of $k\Delta T_m$ or in terms of $k(T_L - T_A)$.

Figure 9:
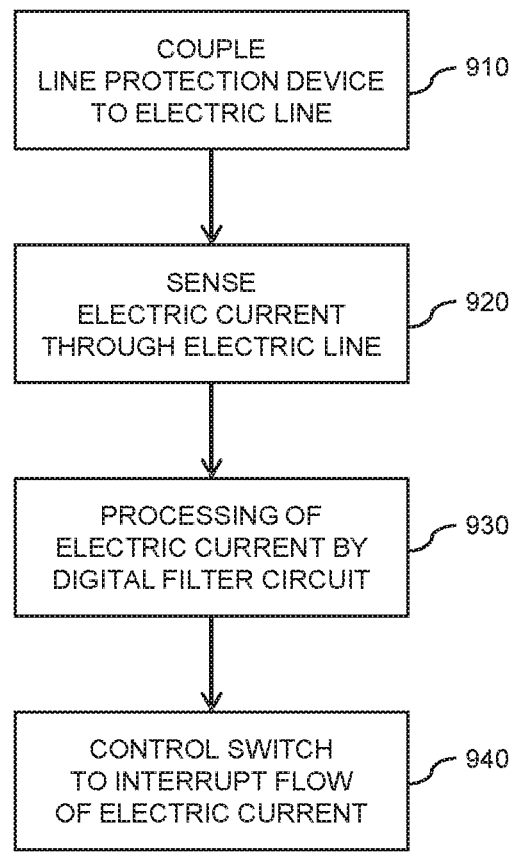
FIG. 9 shows a flowchart for schematically illustrating a method of line protection according to an embodiment of the invention.

FIG. 9 shows a flowchart for illustrating a method which may be used for implementing the concepts as described in the foregoing. The method may for example be performed with the above-mentioned line protection device 100 or 100'.

At 910, a line protection device is connected in series with an electric line, such as the above-mentioned electric line 10. This may be accomplished by using terminals of the line protection device, such as the above-mentioned terminals 101 and 102. At least one of the terminals is used to power components of the line protection device.

At 920, a current sensor of the line protection device senses a value of an electric current through the electric line. The current sensor may for example correspond to the above-mentioned current sensor 120 and be implemented by a shunt resistor and a voltage sensor, like explained in connection with FIG. 8. Further, the current sensor may include at least one of: a level shifter, a measurement amplifier, an anti-aliasing filter, and an analogue-to-digital converter.

At 930, a digital filter circuit performs digital filtering of the value of the electric current. The digital filtering performed by the digital filter circuit may involve low-pass filtering, such as explained in connection with filter block 720. Alternatively or in addition, the digital filtering performed by the digital filter circuit may involve high-pass filtering, such as explained in connection with filter block 760. Further, the digital filtering performed by the digital filter circuit may involve calculating a polynomial function of the value of the electric current, such as explained in connection with filter block 710. The digital filtering performed by the digital filter circuit may then involve low-pass filtering of the calculated polynomial function. The polynomial function may be a second order polynomial function. At the second order polynomial function may have a non-zero linear part and a non-zero quadratic part. However, in some scenarios the second order polynomial function could only have a non-zero quadratic part.

The digital filter circuit may perform the digital filtering on the basis of one or more configurable filter parameters. Such filter parameters may for example include one or more coefficients of the polynomial function, such as the above-mentioned coefficient $k_1$ or $k_2$, a time constant of low-pass filtering, such as the above-mentioned time constant $\tau_P$, or a time constant of high-pass filtering, such as the above-mentioned time constant $\tau_H$. The filter parameters may be configurable through an interface of the line protection device, such as the above-mentioned interface 170.

At 940, a switch is controlled depending on the digitally filtered value of the electric current. The switch may be an internal switch of the line protection device, such as the above-mentioned switch 110. Alternatively, the switch may be an external switch, such as the above-mentioned switch 110'. In the latter case the external switch may be controlled by a control signal output from the line protection device. Depending on the digitally filtered value of the electric current, the switch is controlled to interrupt flow of the electric current through the electric line.

The switch may be controlled depending on a comparison of the digitally filtered value of the electric current to a first threshold, such as for example explained in connection with logic block 730 or logic block 770. Further, the switch may be controlled depending on a comparison of the value of the electric current to a second threshold, such as for example explained in connection with logic block 740. Further, the switch may be controlled depending on an input signal to interrupt the current flow independently of the value of the electric current, such as for example explained in connection with the above-mentioned external input signal IN.

The switch may be controlled on the basis of one or more configurable control parameters. Such control parameters may for example define the above-mentioned first threshold and/or the above-mentioned second threshold. The control parameters may be configurable through an interface of the line protection device, such as the above-mentioned interface 170.

In the method of FIG. 9, at least the digital filter circuit is powered from the at least one terminal used to connect the line protection device in series with the electric line. However, also other components of the line protection device could be powered from the at least one terminal, such as the current sensor or a switch control circuit configured to implement the control operations performed at 940.

It is to be understood that the above-described concepts and embodiments are susceptible to various modifications. For example, the illustrated line protection devices may be implemented on the basis of various types of circuit technology. Further, the illustrated line protection devices and line protection methods could be applied in various application environments, e.g., in the automotive field, in industrial production systems, in home appliances, or home electronic devices.

Some non-limiting embodiments are provided according to the following examples.

Example 1. A line protection device, comprising:
terminals adapted to couple the line protection device in series with an electric line;
a current sensor adapted to a sense a value of an electric current through the electric line;
a digital filter circuit adapted to perform digital filtering of the value of electric current;
a switch control circuit adapted to control a switch to interrupt flow of the electric current through the electric line depending on the digitally filtered value of the electric current; and
a supply circuit adapted to power at least the digital filter circuit from at least one of the terminals.

Example 2. The line protection device according to example 1,
wherein said digital filtering comprises low-pass filtering.

Example 3. The line protection device according to example 1 or 2,
wherein said digital filtering comprises high-pass filtering.

Example 4. The line protection device according to any one of the preceding examples,
wherein said digital filtering comprises calculating a polynomial function of the value of the electric current.

Example 5. The line protection device according to example 4,
wherein said digital filtering comprises low-pass filtering of the calculated polynomial function.

Example 6. The line protection device according to any one of the preceding examples,
wherein the switch control circuit is adapted to control the switch depending on a comparison of the digitally filtered value of the electric current to a first threshold.

Example 7. The line protection device according to any one of the preceding examples,
wherein the switch control circuit is adapted to control the switch depending on a comparison of the value of the electric current to a second threshold.

Example 8. The line protection device according to any one of the preceding examples,
wherein the switch control circuit is adapted to control the switch depending on an input signal to interrupt the electric current independently of the value of the electric current.

Example 9. The line protection device according to any one of the preceding examples,
wherein the digital filter circuit is adapted to operate on the basis of one or more configurable filter parameters.

Example 10. The line protection device according to any one of the preceding examples,
wherein the switch control circuit is adapted to operate on the basis of one or more configurable control parameters.

Example 11. The line protection device according to any one of the preceding examples,
wherein the line protection device comprises the switch.

Example 12. A method of line protection, comprising:
coupling a line protection device in series with an electric line;
sensing a value of an electric current through the electric line by a current sensor of the line protection device;
digital filtering of the value of the electric current by a digital filter circuit of the line protection device;
depending on the digitally filtered value of the electric current, controlling a switch to interrupt flow of the electric current through the electric line; and
powering the digital filter circuit from at least one terminal used to connect the line protection device in series with the electric line.

Example 13. The method according to example 12,
wherein said digital filtering comprises low-pass filtering.

Example 14. The method according to example 12 or 13,
wherein said digital filtering comprises high-pass filtering.

Example 15. The method according to any one of examples 12-14,
wherein said digital filtering comprises calculating a polynomial function of the value of the electric current.

Example 16. The method according to example 15,
wherein said digital filtering comprises low-pass filtering of the calculated polynomial function.

Example 17. The method according to any one of examples 12-16, comprising:
controlling the switch depending on a comparison of the digitally filtered value of the electric current to a first threshold.

Example 18. The method according to any one of examples 12-17, comprising:
controlling the switch depending on a comparison of the value of the electric current to a second threshold.

Example 19. The method according to any one of examples 12-18, comprising:
controlling the switch depending on an input signal to interrupt the current flow independently of the value of the electric current.

Example 20. The method according to any one of examples 12-19, comprising:
performing said digital filtering on the basis of one or more configurable filter parameters.

Example 21. The method according to any one of examples 12-20,
controlling the switch on the basis of one or more configurable control parameters.

In view of the many variations and modifications discussed above, it is evident that the embodiments are not to be construed as limiting the scope of the present application in any way.

What is claimed is:

1. A line protection device comprising:
   terminals adapted to couple the line protection device in series with an electric line;
   a current sensor adapted to a sense a value of an electric current through the electric line;
   a digital filter circuit adapted to perform digital filtering of the value of electric current, wherein the digital filter circuit is adapted to perform the digital filtering by calculating a polynomial function of the value of the electric current;
   a switch control circuit adapted to control a switch to interrupt flow of the electric current through the electric line depending on the digitally filtered value of the electric current; and
   a supply circuit adapted to power at least the digital filter circuit from at least one of the terminals.

2. The line protection device according to claim 1, wherein the digital filtering comprises low-pass filtering.

3. The line protection device according to claim 1, wherein the digital filtering comprises high-pass filtering.

4. The line protection device according to claim 1, wherein the digital filtering comprises low-pass filtering of the calculated polynomial function.

5. The line protection device according to claim 1, wherein the switch control circuit is adapted to control the switch depending on a comparison of the digitally filtered value of the electric current to a first threshold.

6. The line protection device according to claim 1, wherein the switch control circuit is adapted to control the switch depending on a comparison of the value of the electric current to a second threshold.

7. The line protection device according to claim 1, wherein the switch control circuit is adapted to control the switch depending on an input signal to interrupt the electric current independently of the value of the electric current.

8. The line protection device according to claim 1, wherein the digital filter circuit is adapted to operate on the basis of one or more configurable filter parameters.

9. The line protection device according to claim 1, wherein the switch control circuit is adapted to operate on the basis of one or more configurable control parameters.

10. The line protection device according to claim 1, wherein the line protection device comprises the switch.

11. A method of line protection, the method comprising:
    coupling a line protection device in series with an electric line;
    sensing a value of an electric current through the electric line by a current sensor of the line protection device;
    digital filtering of the value of the electric current by a digital filter circuit of the line protection device, wherein digital filtering of the value of the electric current comprises calculating a polynomial function of the value of the electric current;
    depending on the digitally filtered value of the electric current, controlling a switch to interrupt flow of the electric current through the electric line; and
    powering the digital filter circuit from at least one terminal used to connect the line protection device in series with the electric line.

12. The method according to claim 11, wherein the digital filtering comprises low-pass filtering.

13. The method according to claim 11, wherein the digital filtering comprises high-pass filtering.

14. The method according to claim 11, wherein the digital filtering comprises low-pass filtering of the calculated polynomial function.

15. The method according to claim 11, further comprising controlling the switch depending on a comparison of the digitally filtered value of the electric current to a first threshold.

16. The method according to claim 11, further comprising controlling the switch depending on a comparison of the value of the electric current to a second threshold.

17. The method according to claim 11, further comprising controlling the switch depending on an input signal to interrupt the current flow independently of the value of the electric current.

18. The method according to claim 11, further comprising performing the digital filtering on the basis of one or more configurable filter parameters.

19. The method according to claim 11, further comprising controlling the switch on the basis of one or more configurable control parameters.

20. A line protection device comprising:
    terminals adapted to couple the line protection device in series with an electric line;
    a current sensor adapted to a sense a value of an electric current through the electric line;
    a digital filter circuit adapted to perform digital filtering of the value of electric current, wherein the digital filter circuit is adapted to perform the digital filtering by:
        calculating a polynomial function of the value of the electric current;
        low-pass filtering of the calculated polynomial function to generate a low-pass filtered value; and
        high-pass filtering of the value of the electrical current to generate a high-pass filtered value;
    a switch control circuit adapted to:
        control the switch depending on a comparison of the low-pass filtered value to a first threshold;
        control the switch depending on a comparison of the high-pass filtered value to a second threshold; and
        control the switch depending on a comparison of the value of the electric current to a third threshold; and
    a supply circuit adapted to power at least the digital filter circuit from at least one of the terminals.

21. The line protection device according to claim 19, wherein the digital filter circuit is adapted to operate on the basis of a first set of one or more configurable filter parameters, or
wherein the switch control circuit is adapted to operate on the basis of a second set of one or more configurable control parameters.

* * * * *

UNITED STATES PATENT AND TRADEMARK OFFICE
CERTIFICATE OF CORRECTION

PATENT NO. : 10,559,952 B2
APPLICATION NO. : 15/675097
DATED : February 11, 2020
INVENTOR(S) : Michael Asam and Alfons Graf Page 1 of 1

It is certified that error appears in the above-identified patent and that said Letters Patent is hereby corrected as shown below:

In the Claims

Column 18, Claim 21, Line 54: "...according to claim 19..." should be --...according to claim 20...--

Signed and Sealed this
Seventeenth Day of November, 2020

Andrei Iancu
*Director of the United States Patent and Trademark Office*